United States Patent [19]

Kikuchi

[11] Patent Number: 4,709,403
[45] Date of Patent: Nov. 24, 1987

[54] APPARATUS FOR CONTROLLING OUTPUT POWER OF TRANSMITTER

[75] Inventor: Jiro Kikuchi, Soma, Japan

[73] Assignee: Alps Electric Co., Ltd., Japan

[21] Appl. No.: 840,323

[22] Filed: Mar. 14, 1986

[30] Foreign Application Priority Data

Mar. 14, 1985 [JP] Japan .................................. 60-51302

[51] Int. Cl.⁴ .......................... H04B 1/04; H03G 3/00
[52] U.S. Cl. .................................... 455/126; 455/117; 330/279; 330/284; 330/207 P
[58] Field of Search ................. 455/115–117, 455/126; 330/278–280, 284, 298, 138, 139, 207 P

[56] References Cited

U.S. PATENT DOCUMENTS

| | | | |
|---|---|---|---|
| 3,486,128 | 12/1969 | Lohemann | 455/126 |
| 3,662,290 | 5/1972 | Elliott | 455/126 |
| 3,900,823 | 8/1975 | Sokal et al. | 455/126 |
| 4,066,965 | 1/1978 | Schultz et al. | 455/126 |
| 4,392,245 | 7/1983 | Mitama | 455/116 |
| 4,563,775 | 1/1986 | Yokosuka | 455/126 |

Primary Examiner—Jin F. Ng
Attorney, Agent, or Firm—Guy W. Shoup

[57] ABSTRACT

An apparatus for controlling the output power of a transmitter that is installed in a vehicle or used in a mobile radio communication equipment has a power amplifier, a coupler for delivering an output corresponding to the output power from the power amplifier, a detector disposed after the coupler, a comparator for delivering an output proportional to the difference between the output voltage from the demodulator and a reference voltage, and a voltage control circuit for controlling the output power of the power amplifier in response to the output from the comparator. An RF variable attenuator is disposed before the comparator to compress the dynamic range of the signal applied to the voltage control circuit.

2 Claims, 5 Drawing Figures

APPARATUS FOR CONTROLLING OUTPUT POWER OF TRANSMITTER

FIELD OF THE INVENTION

The present invention relates to an apparatus for controlling the output power of a transmitter installed in a vehicle or used in a portable, mobile radio communication equipment.

BACKGROUND OF THE INVENTION

In general, the output power of a radio transmitter is varied by changes in the voltage of the power supply, the ambient temperature, RF load, etc. To avoid this undesirable situation, an automatic power control circuit has been used to stabilize the output power.

A conventional apparatus of this kind for controlling the output power of a transmitter is shown in FIG. 4. This apparatus has a power amplifier 1, a coupler 2, an RF amplifier 3, a detector 4, a comparator 5, and a voltage control circuit 6. These components 1–6 constitute an automatic power control loop, abbreviated APC loop. Radio signals are received at an input terminal 7. Also included in the apparatus are an antenna ANT and a reference voltage terminal 8.

When the output power of the transmitter is varied due to changes in the ambient temperature, for example, the coupler 2 delivers an output corresponding to the variation. This output signal is then amplified by the RF amplifier 3. Then, the detector 4 produces an output corresponding to the varying output power. The comparator 5 delivers an output proportional to the difference between the output from the detector 4 and the reference voltage applied at the reference voltage terminal 8. The output voltage from the comparator is supplied to the voltage control circuit 6 to control the voltage of the power supply for the power amplifier 1, for maintaining the output power of the transmitter constant.

In mobile radio communication, the output power of a mobile station is exponentially increased or reduced according to the electric field produced by receiving the waves from a base station, i.e., according to the distance from the base station, because it is effective in suppressing the reception sensitivity at the base station and removing transmission intermodulation. Further, it is preferable in that it curtails the electric power consumed by the mobile station itself. Therefore, this is the method generally adopted. Even if this method is employed, it is required that the output voltage from the detector 4 be restricted to a certain range and that the comparator 5 be operated within a given dynamic range to properly operate the APC loop. For this reason, an RF variable attenuator 9 is inserted between the coupler 2 and the RF amplifier 3. An output power setter 10 for switching the amount of attenuation introduced by the attenuator 9 between a plurality of values is connected to the attenuator 9. An input terminal 11 at which a control signal is applied is connected to the setter 10.

Another conventional apparatus is shown in FIG. 5. It is to be noted that like components are denoted by like reference numerals throughout FIGS. 4 and 5. Instead of the RF variable attenuator and other components shown in FIG. 4, this apparatus uses a first resistive potential divider consisting of two resistors $R_1$ and $R_2$, a first switch circuit 12, a second resistive potential divider consisting of three resistors $R_3$, $R_4$, $R_5$, a second switch circuit 13, and a switching device 14. This device 14 determines the output power of the transmitter, based on the intensity of the electric field produced by receiving waves from a base station, and controls the switching action of the switching circuits 12 and 13. A terminal 15 is provided for connection with a power supply. Each of the first and second switch circuits 12 and 13 incorporates a parallel combination of a plurality of resistors (not shown). A switch is connected to each of these resistors. The output from the switching device 14 turns on some of these switches and switches from some resistors in the switch circuit 12 or 13 to other resistors. When the output power of the transmitter is maintained in steady state, the output from the switching device 14 turns on the first switch circuit 12 so that the amount of attenuation introduced by the first resistive potential divider ($R_1$, $R_2$) may be set to a large value. Thus, the voltage supplied from the detector 4 into the comparator 5 is limited. At the same time, the amount of attenuation introduced by the second resistive potential divider is set to a small value. When the output power of the transmitter is set to a low level, the second switch circuit 13 is turned on in such a way that the amount of attenuation introduced by the second resistive potential divider is set to a large value. As a result, the reference voltage is set to a low level. The output voltage from the demodulator 4 is applied to the comparator 5 via the resistor $R_1$. In this way, the APC loop functions properly both during steady-state transmission and during low-level transmission.

In the conventional apparatus shown in FIG. 4, even during the transmission at the maximum power level, the output level from the detector 4 is required to be restricted to a certain range. Accordingly, the maximum amount of attenuation introduced by the RF variable attenuator 9 must be set to a large value. This makes the attenuator 9 complex and bulky. When the output power of the transmitter is at a low level, the voltage from the coupler 2 is greatly attenuated by the attenuator 9 and so the RF amplifier 3 must have a large amplification factor. Thus, the number of stages of amplification is large, making the circuitry complex. Since the attenuator 9 is designed to exhibit a large maximum amount of attenuation, it is greatly affected by other RF radiation. Therefore, the attenuator 9 must be shielded, or other countermeasure must be taken. Further, since the RF amplifier 4 has a large amplification factor, it must be shielded or otherwise processed to prevent it from being affected by other radiation and prevent abnormal oscillation. In this way, this apparatus has various problems.

In the conventional apparatus shown in FIG. 5, when the parallel combination of resistors and switches included in the first switch circuit 12 is made up of a small number of components, if the output power of the transmitter is switched to other level so that it may be varied exponentially, the detector voltage applied to the comparator 5 also varies exponentially. Therefore, it is also necessary that the reference voltage be increased or reduced exponentially. This makes it difficult to appropriately set the values of the resistors $R_3$, $R_5$, etc. included in the second resistive potential divider. Further, since the resistance values are susceptible to change due to temperature increase or for other cause, the stability of the output power is poor. When the first switch circuit 12 including the resistors and switches is made up of a large number of components, it is easy to set the resistance value of the second resistive potential divider. However, the configuration of the first switch circuit 12 is made complex.

SUMMARY OF THE INVENTION

It is the object of the present invention to provide an apparatus which controls the output power of a transmitter, is free of the foregoing problems, is simple in circuit configuration, and allows a comparator to operate equivalently in a wide dynamic range.

The above object is achieved by an output power control apparatus comprising: a power amplifier for amplifying RF signals to be transmitted and delivering an output power to be transmitted; a coupler for detecting the output power to be transmitted and delivering an output corresponding to the intensity of the detected power; a detector that receives the output from the coupler and delivers an output voltage corresponding to the intensity of the output power to be transmitted; a comparator for delivering a voltage proportional to the difference between the output voltage from the detector and a reference voltage; and a voltage control circuit that receives the output voltage from the comparator and controls the intensity of the output power to be transmitted, the output power control apparatus being characterized in that an RF variable attenuator which attenuates its input signal to a larger or lesser extent according to the magnitude of the output voltage from the detector is disposed at the stage preceding the comparator, and that the reference voltage is set corresponding to the intensity of the output power to be transmitted, whereby the comparator operates equivalently in a wide dynamic range.

The output voltage from the detector varies according to the intensity of the output power to be transmitted. The RF variable attenuator which attenuates its input signal to a greater or lesser extent according to the magnitude of the output voltage from the detector is disposed at the stage preceding the comparator. Therefore, the voltage which is applied to the comparator so as to be compared with the reference voltage is compressed. As a result, the dynamic range of the comparator is increased in an equivalent manner.

DETAILED DESCRIPTION OF THE INVENTION

Figure 1:
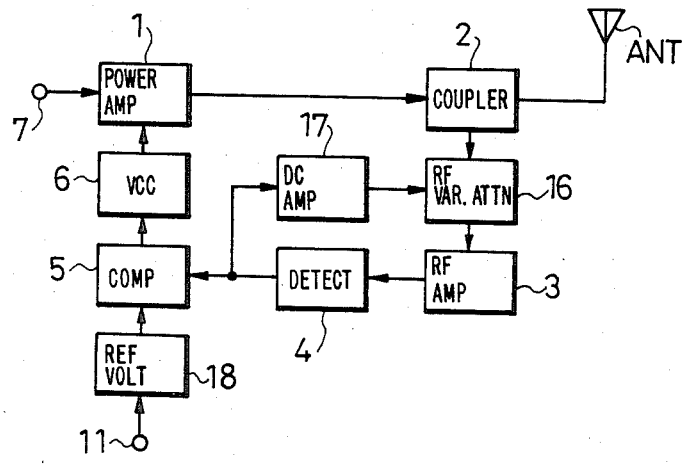
FIG. 1 is a block diagram of a transmitter output power control apparatus according to the invention.
Figure 5:
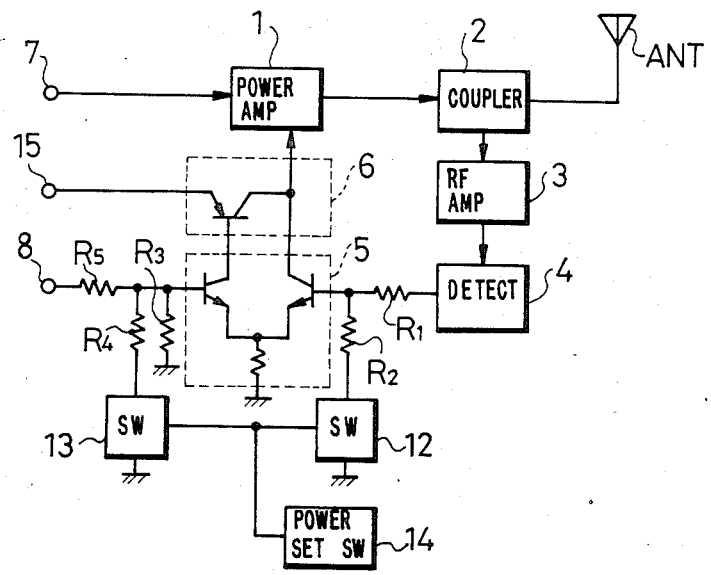

Referring to FIG. 1, there is shown an apparatus embodying the concept of the present invention. It is to be noted that like components are denoted by like reference numerals throughout FIGS. 1 and 5, and such components will not be described hereinafter for the sake of simplicity. This apparatus has an RF variable attenuator 16 inserted between coupler 2 and RF amplifier 3. The output from the detector 4 is fed to a DC amplifier 17, as well as to comparator 5. The output from the amplifier 17 is applied to the attenuator 16.

Thus, the automatic power control (APC) loop includes a subloop consisting of RF variable attenuator 16, RF amplifier 3, detector 4, and DC amplifier 17.

A reference voltage setting circuit 18 for setting the level of the output power of the transmitter applies a reference voltage to the comparator 5. A control signal input terminal 11 is connected to the circuit 18 so that an output power control signal that varies according to the intensity of the received electric field is applied to the circuit 18.

Figure 2:
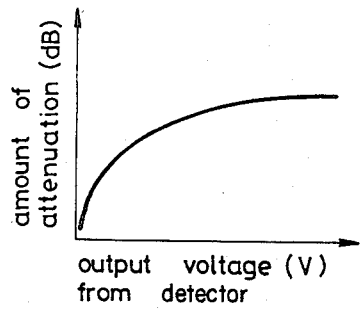
FIG. 2 is a graph showing the attenuation characteristic of the RF variable attenuator incorporated in the apparatus shown in FIG. 1.
Figure 3:
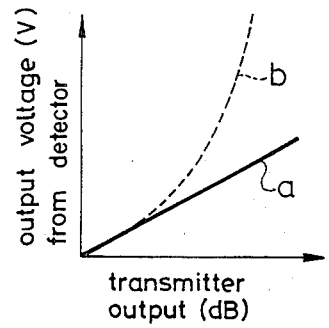
FIG. 3 is a graph showing the output characteristic of the detector incorporated in the apparatus shown in FIG. 1, as well as the output characteristic of a conventional apparatus.
Figure 4:
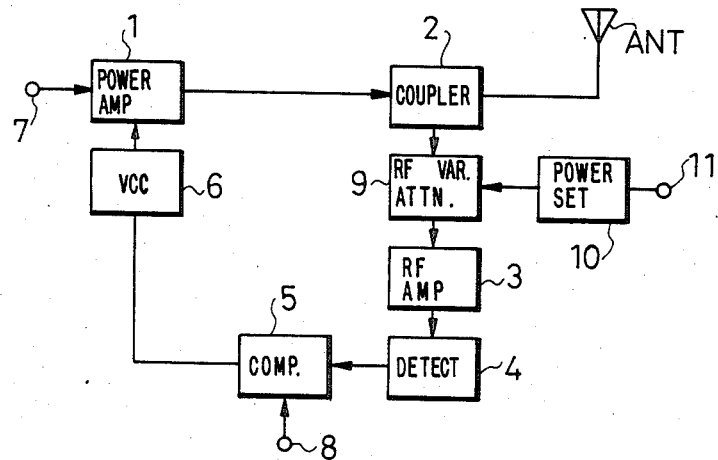
FIGS. 4 and 5 are block diagrams of conventional transmitter output power control apparatuses.

The operation of the apparatus constructed as described above is described by referring also to FIGS. 2 and 3. Where the subloop mentioned above does not exist, if the output power is increased exponentially, the output voltage from the detector 4 also increases exponentially accordingly. That is, the voltage from the detector shows a characteristics as indicated by b in FIG. 3. In accordance with the invention, the output voltage from the detector 4 is amplified by the DC amplifier 17, and then it is fed back to the RF variable attenuator 16 as a control voltage. When the output power of the transmitter is large, the amount of attenuation introduced by the attenuator 16 is controlled so as to assume a large value. On the other hand, when the power is small and the output voltage from the detector is low, the amount of attenuation introduced by the attenuator 16 is controlled so as to assume a small value. FIG. 2 is a curve showing the amount of attenuation introduced by the attenuator 16 against the output voltage from the detector. As a result, the output voltage from the detector 4 is compressed as indicated by a in FIG. 3.

The reference voltage applied to the comparator 5 is varied according to the magnitude of the output power of the transmitter by the action of the reference voltage setting circuit 18. The compression of the output voltage from the detector 4 equivalently increases the dynamic range of the comparator 5. Therefore, even if the output power is increased or reduced exponentially, the APC loop functions properly, assuring stable control over the output power.

The DC amplifier 17 may be an inverting amplifier, depending on the manner in which the RF variable attenuator 16 is controlled.

As described thus far in detail, the novel apparatus has an APC loop in which an RF variable attenuator is disposed at the stage preceding a comparator, the amount of attenuation introduced by the attenuator being increased or reduced according to the magnitude of the output voltage from a detector. A reference voltage applied to the comparator is set corresponding to the magnitude of the output power of the transmitter. Therefore, the dynamic range of the comparator can be equivalently increased by the action of the comparator itself and also by the attenuator. Accordingly, it is not necessary to set the maximum amount of attenuation introduced by the attenuator to a large value, unlike the prior art apparatus. Hence, the RF variable attenuator is simple in internal structure. Further, it is not required to be shielded or otherwise processed. Consequently, the peripheral portions can also be made simple in structure. Furthermore, since the output voltage from the detector which is applied to the comparator is compressed, the reference voltage set by the reference voltage setting circuit can be readily determined to match it to a given output power of the transmitter.

What is claimed is:

1. An apparatus for controlling the output power of a transmitter, comprising:
   a power amplifier for amplifying RF signals to be transmitted and delivering output signals to be transmitted;
   a coupler receiving the output of said power amplifier and providing to an antenna the output signals having an output power to be transmitted and a feedback signal indicating the output power of the output signals;
   a detector connected to receive the feedback signal from said coupler for detecting the output power of the output signals and providing a detection voltage corresponding thereto;
   a comparator receiving the detection voltage from said detector for comparing said detection voltage to a reference voltage set corresponding to a desired level of output power to be transmitted, and providing a difference signal corresponding to the difference between said voltages;
   a voltage control circuit receiving the difference signal from said comparator for controlling a power supply to said power amplifier in accordance with the difference signal, whereby the output power of the output signals can be maintained constant at a desired level; and
   a subloop including an RF variable attenuator connected between the feedback signal output of said coupler and the input to said detector and receiving as an input the detection voltage of said detector, whereby the feedback signal of said coupler is variably attenuated according to the output voltage from said detector so that the dynamic range of said comparator is equivalently increased and the necessity for setting a maximum amount of attenuation for said attenuator is avoided.

2. An apparatus as set forth in claim 1, wherein a DC amplifier is inserted between the detector and the variable attenuator, and an RF amplifier is inserted between the attenuator and the detector, so that the attenuator, the RF amplifier, the detector, and the DC amplifier form said subloop.

* * * * *